United States Patent
Hess et al.

(10) Patent No.: US 8,318,549 B2
(45) Date of Patent: Nov. 27, 2012

(54) MOLDED SEMICONDUCTOR PACKAGE HAVING A FILLER MATERIAL

(75) Inventors: Kevin J. Hess, Round Rock, TX (US); Chu-Chung Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 504 days.

(21) Appl. No.: 12/608,780

(22) Filed: Oct. 29, 2009

(65) Prior Publication Data
US 2011/0101517 A1    May 5, 2011

(51) Int. Cl.
*H01L 21/00* (2006.01)
*H01L 23/28* (2006.01)
*H01L 23/29* (2006.01)

(52) U.S. Cl. ........ 438/127; 438/124; 438/126; 257/787; 257/789; 257/E23.121; 257/E23.125; 257/E23.128; 257/E23.131; 257/E21.503; 257/E21.504

(58) Field of Classification Search .................. 257/787, 257/789, E23.121, E23.125, E23.128, E23.131, 257/E21.503, E21.504; 438/126, 127, 124
See application file for complete search history.

(56) References Cited

U.S. PATENT DOCUMENTS

| | | | | |
|---|---|---|---|---|
| 5,182,853 | A * | 2/1993 | Kobayashi et al. | 29/841 |
| 5,609,889 | A * | 3/1997 | Weber | 425/116 |
| 5,679,978 | A * | 10/1997 | Kawahara et al. | 257/697 |
| 5,776,512 | A * | 7/1998 | Weber | 425/116 |
| 6,309,575 | B1 * | 10/2001 | Boutin et al. | 264/161 |
| 6,383,846 | B1 * | 5/2002 | Shen et al. | 438/127 |
| 7,015,593 | B2 * | 3/2006 | Kazama | 257/790 |
| 2003/0080341 | A1 * | 5/2003 | Sakano et al. | 257/79 |
| 2008/0164593 | A1 * | 7/2008 | Hess et al. | 257/682 |
| 2009/0107093 | A1 * | 4/2009 | Ogino et al. | 55/473 |

OTHER PUBLICATIONS

Muniandy, K. et al. "Top-Gate Molding Process Development of Cavity Down TBGA for High Density Wire Bonding and Low K Dielectric Wafer Technology Application"; International Electronic Manufacturing Technology 2006, Malaysia; 2006; pp. 390-393; USA.
Tran, T. A. et al.; "Overcoming Challenges in Thermally Enhanced BGA Packaging with Low-k Silicon"; Electronics Design & Manufacturing Symposium & Vendor Show; Oct. 22, 2009; 8 pgs; International Microelectronics & Packaging Society, USA.
U.S. Appl. No. 12/201,623, filed Aug. 29, 2008.

* cited by examiner

*Primary Examiner* — Cheung Lee
*Assistant Examiner* — Jeremy Joy
(74) *Attorney, Agent, or Firm* — James L. Clingan, Jr.

(57) ABSTRACT

An integrated circuit is attached to a package substrate. The integrated circuit is electrically connected to the package substrate using a plurality of bond wires connected between a plurality of bond posts and a plurality of bond pads. A first plurality of the bond pads are along a first side of the integrated circuit and coupled to a first plurality of the bond posts with a first plurality of the bond wires. A second plurality of the bond pads are along a second side of the integrated circuit and coupled to a second plurality of the bond posts with a second plurality of the bond wires. Mold compound is injected through a plurality of openings in the package substrate. A first opening is between the first plurality of bond posts and the first side. A second opening is between the second plurality of bond posts and the second side.

19 Claims, 5 Drawing Sheets

MOLDED SEMICONDUCTOR PACKAGE HAVING A FILLER MATERIAL

BACKGROUND

1. Field

This disclosure relates generally to semiconductor packages, and more specifically, to a molded semiconductor package having a filler material.

2. Related Art

Typically semiconductor packages have a die attached to a substrate. Bond pads located on the die are connected using wires to bond posts located on the substrate. Increasingly, semiconductor packages include a large number of wires because of higher pin count. In addition, certain semiconductor packages may include multi-tier pad rings for connecting wires to the die. As a result, these semiconductor packages have a high wire density. In particular, in some instances the wires may be so close to each other—particularly near the die—that the wire density may exceed 20 wires per millimeter of die edge.

The die and the wires connecting the bond pads to the bond posts are molded over using a mold compound. To ensure reliability of the semiconductor package, the mold compound is selected in a manner that its coefficient of thermal expansion (CTE) is as close as possible to the CTE of the substrate and the die. To achieve this objective, typically mold compound includes a combination of a resin and a filler material. The filler material is carefully selected to ensure that the CTE of the combination of the resin and the filler material is as close as possible to the CTE of the substrate and the die. Filler material may have particles that vary in size from 5 microns to 70 microns. As part of the molding process, the mold compound, including the filler material, is flowed across a top surface of the die contained in the semiconductor package.

As noted above, increasingly the semiconductor packages have a high wire density, which in turn results in screening out of the filler particles in certain regions of the molded semiconductor package. In particular, by way of example, the regions of mold compound near the die edges may have filler material screened out. This causes the CTE of such areas to be higher than the CTE of the die and the substrate. Such mismatch in the CTE of these areas and the die and the substrate makes these areas prone to developing cracks. Such cracks can degrade the reliability of the semiconductor packages. By way of example, a crack formed in the molded package area near the die may transfer enough stress to a joint between the bond pad and the ball bond that the wire may be electrically de-coupled from the bond pad. This in turn can cause the molded semiconductor package to become dysfunctional.

Accordingly, there is a need for a molded semiconductor package that is more reliable.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a method of packaging an integrated circuit on a package substrate is provided. The method may include attaching the integrated circuit to the package substrate. The method may further include forming electrical connections between the integrated circuit and the package substrate using a first plurality of bond wires connected to a first plurality of bond posts on the package substrate and a first plurality of bond pads along a first side of the integrated circuit and a second plurality of bond wires connected to a second plurality of bond posts on the package substrate and a second plurality of bond pads along a second side of the integrated circuit. The method may further include injecting mold compound through a plurality of openings in the package substrate, wherein a first opening of the plurality of openings is between the first plurality of bond posts and the first side and a second opening of the plurality of openings is between the second plurality of bond posts and the second side, wherein the injecting results in applying the mold compound over the integrated circuit and the package substrate.

In another aspect, a packaged integrated circuit is provided. The packaged integrated circuit may include a package substrate and an integrated circuit on a top surface of the package substrate, wherein the integrated circuit has a first side, a second side, a third side, and a fourth side. The packaged integrated circuit may further include: (1) a first plurality of wire bonds extending from the top surface along the first side to the package substrate; (2) a second plurality of wire bonds extending from the top surface along the second side to the package substrate; (3) a third plurality of wire bonds extending from the top surface along the third side to the package substrate; and (4) a fourth plurality of wire bonds extending from the top surface along the fourth side to the package substrate. The packaged integrated circuit may further include mold compound over the package substrate and the integrated circuit wherein the mold compound under the first, second, third, and fourth plurality of wire bonds adjacent to the first, second, third, and fourth sides has a concentration of filler greater than that of the mold compound over the first, second, third, and fourth plurality of wire bonds.

In yet another aspect, a method of forming mold compound over an integrated circuit attached to a top surface of a package substrate is provided. The method may include attaching bond wires between the package substrate and along each side of the integrated circuit. The method may further include forming a plurality of openings in the package substrate under the wire bonds, wherein there is at least one opening of the plurality of openings adjacent to each side of the integrated circuit. The method may further include injecting mold compound through the plurality of openings.

Figure 1:
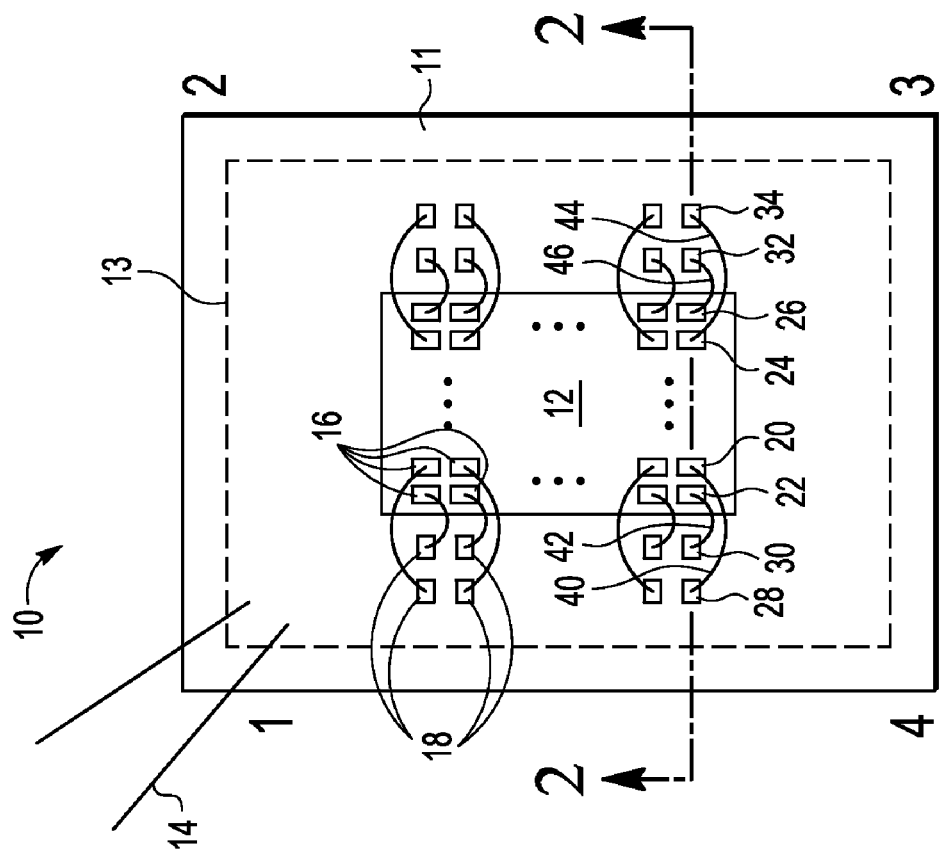
FIG. 1 shows a top view of an exemplary molded semiconductor package.

FIG. 1 shows a top view of an exemplary molded semiconductor package 10. Molded semiconductor package 10 may include a package substrate 11 having a die 12 located in a mold cap boundary 13. Die 12 may be referred to herein as an integrated circuit. Die 12 may be attached to package substrate 11 using a die attach material, for example. Substrate 11 can be any suitable package substrate, such as bismaleimide triazine (BT) resin, FR4 laminate, the like, and combinations of the above. Die 12 may have bond pads 16 that may be coupled to bond posts 18 using wires. Die 12 may have additional bond pads 20, 22, 24, and 26 that may be coupled to bond posts 28, 30, 34, and 32 using wires 40, 42, 44, and 46. In one embodiment, these wires (referred to herein as bond wires) may be gold wires. Molded semiconductor package 10 may have four corners 1, 2, 3, and 4. In one embodiment, the molded semiconductor package may be formed by flowing mold compound from gate 14 located in corner 1. The mold compound may flow across the top surface of die 12. Mold compound may include a filler material. The filler material may be any suitable material, such as alumina, silica, boron nitride, silicon dioxide, the like, or combinations of the above. Although FIG. 1 shows molded semiconductor package 10 with a specific number of components arranged in a specific manner, the molded semiconductor package may include additional or fewer elements that may be arranged differently.

Figure 2:
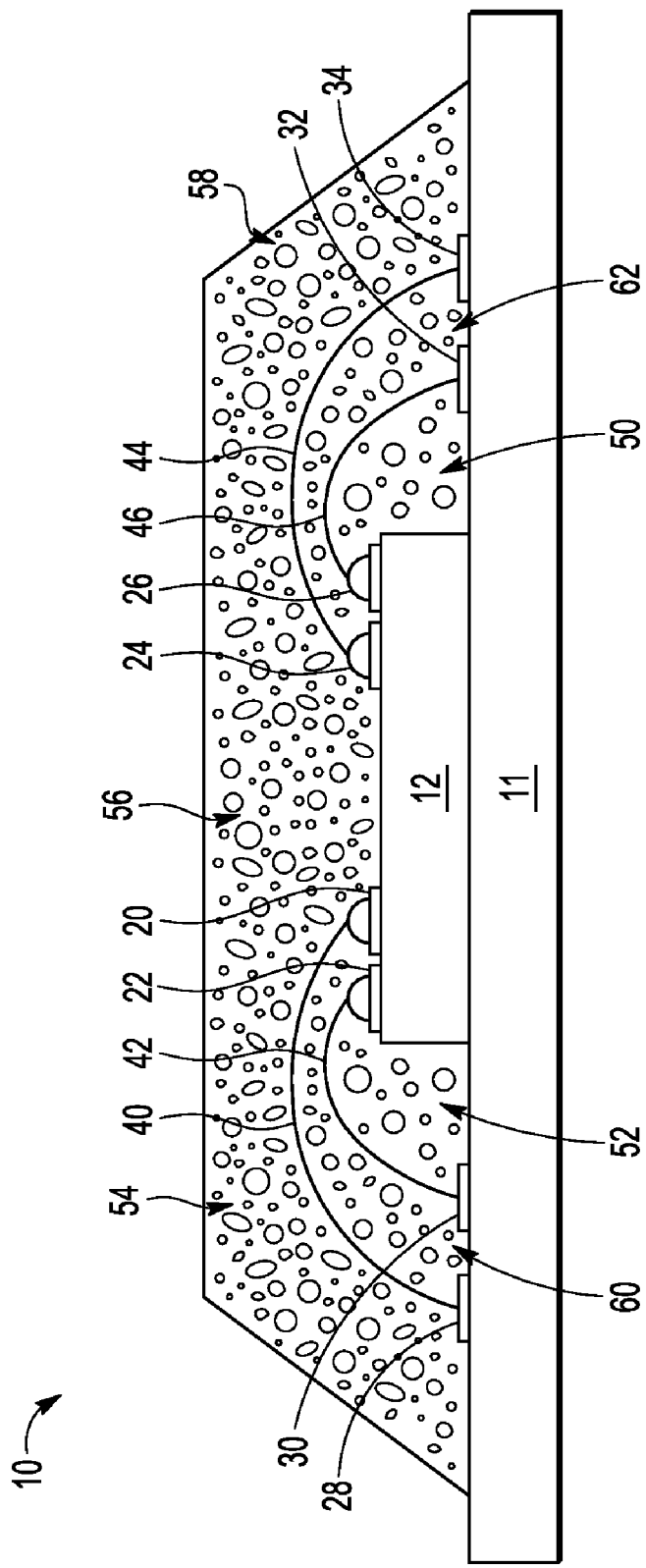
FIG. 2 shows a cross-section view of the exemplary molded semiconductor package of FIG. 1.

FIG. 2 shows a cross-section view (2-2) of the exemplary molded semiconductor package 10 of FIG. 1. The same reference numerals as used as in FIG. 1 are used to point out the same elements of molded semiconductor package 10 and are described with reference to FIG. 2 only as needed. The cross-section view of molded semiconductor package 10 shows the filler material particles, illustrated by oval and spherical shapes of various sizes, embedded in resin material. Since, during the forming of the mold cap, the mold compound including the filler material is injected via gate 14, located at corner 1, the filler material is not evenly distributed across the molded semiconductor package because of the screening out of the filler material by wires, such as wires 40, 42, 44, and 46. This screening out of the filler material results in regions with high, medium, and low amounts of filler material. By way of example, FIG. 2 shows: low filler regions 50 and 52; medium filler regions 60 and 62; and high filler regions 54, 56, and 58. In one embodiment, low filler region 50 may be a region between one side of die 12 and the low-profile wires on that side, such as wire 46 and low filler region 52 may be a region between another side of die 12 and the low-profile wires on that side, such as wire 42. In one embodiment, medium filler region 60 may be a region between the low-profile wires, such as wire 42 and the high-profile wires, such as 40 and medium filler region 62 may be a region between the low-profile wires, such as wire 46 and high-profile wires, such as wire 44. In one embodiment, high filler regions 54, 56, and 58 may be the remaining regions of molded semiconductor package 10. Although FIG. 2 shows a specific number of filler regions formed in specific areas of molded semiconductor package 10, the molded semiconductor package may include fewer or additional filler regions formed in other areas.

Figure 3:
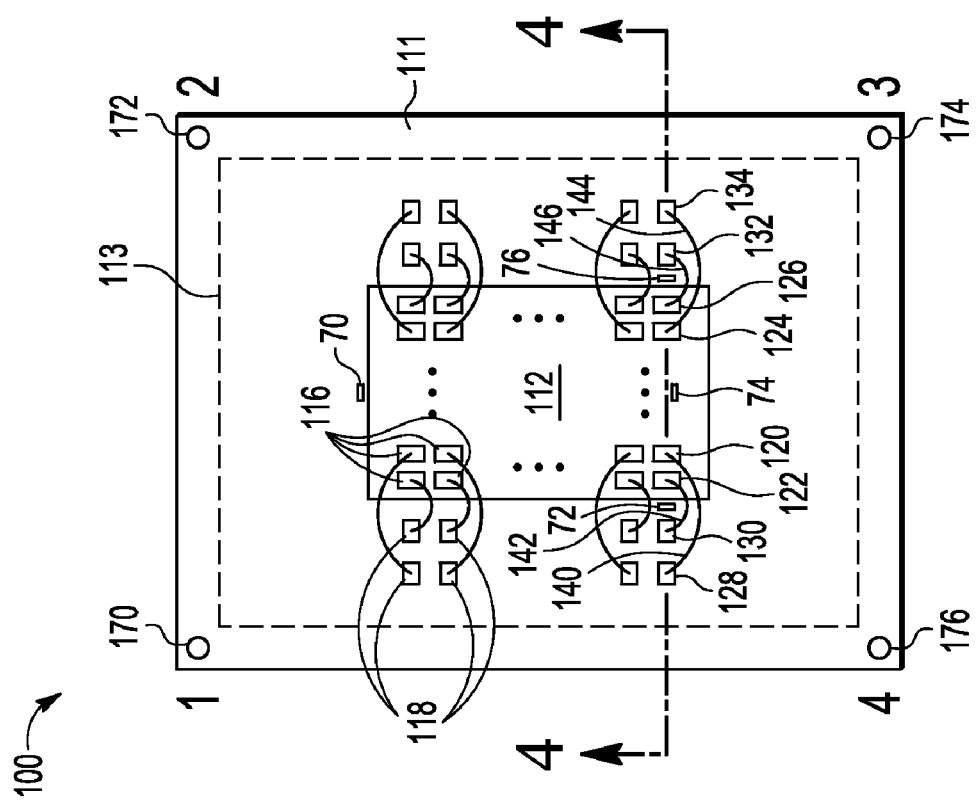
FIG. 3 shows a top view of another exemplary molded semiconductor package.

FIG. 3 shows a top view of another exemplary molded semiconductor package 100. Molded semiconductor package 100 may include a package substrate 111 having a die 112 located in a mold cap boundary 113. Die 112 may be referred to herein as an integrated circuit. Die 112 may be attached to substrate 111 using a die attach material. Substrate 111 can be any suitable package substrate, such as bismaleimide triazine (BT) resin, FR4 laminate, the like, and combinations of the above. Die 112 may have bond pads 116 that may be coupled to bond posts 118 using wires. Die 112 may have additional bond pads 120, 122, 124, and 126 that may be coupled to bond posts 128, 130, 134, and 132 using wires 140, 142, 144, and 146. In one embodiment, these wires (referred to herein as bond wires) may be gold wires. Molded semiconductor package 100 may have four corners 1, 2, 3, and 4. In one embodiment, during the forming of the mold cap, mold compound may be flowed from openings, such as gates 70, 72, 74, and 76. Molded semiconductor package 100 may have vents 170, 172, 174, and 176 to vent out any air that may be displaced by the flowing molding compound. Gate 70 may be located between a side of die 112 (side between corners 1 and 2) and bond posts (not shown) located on substrate 111 across from that side of die 112. Gate 72 may be located between another side of die 112 (side between corners 1 and 4) and bond posts (128 and 130, for example) located on substrate 111 across from that side of die 112. Gate 74 may be located between yet another side of die 112 (side between corners 3 and 4, for example) and bond posts (not shown) located on the substrate 111 across from that side of die 112. Gate 76 may be located between still another side of die 112 (side between corners 2 and 3, for example) and bond posts (132 and 134, for example) located on the substrate 111 across from that side of die 112. Although FIG. 3 shows four openings for injecting mold compound, additional or fewer openings may be used to inject mold compound. In addition, these openings may be arranged differently from the way that they are shown in FIG. 3. The mold compound may be injected through these openings (gates 70, 72, 74, and 76, for example) and may fill the regions under the wires and then may flow across the top surface of die 112. Mold compound may include a filler material. The filler material may be any suitable material, such as alumina, silica, boron nitride, silicon dioxide, the like, or combinations of the above. Although FIG. 3 shows molded semiconductor package 100 having a specific number of components arranged in a specific manner, the molded semiconductor package may include additional or fewer elements that may be arranged differently.

Figure 4:
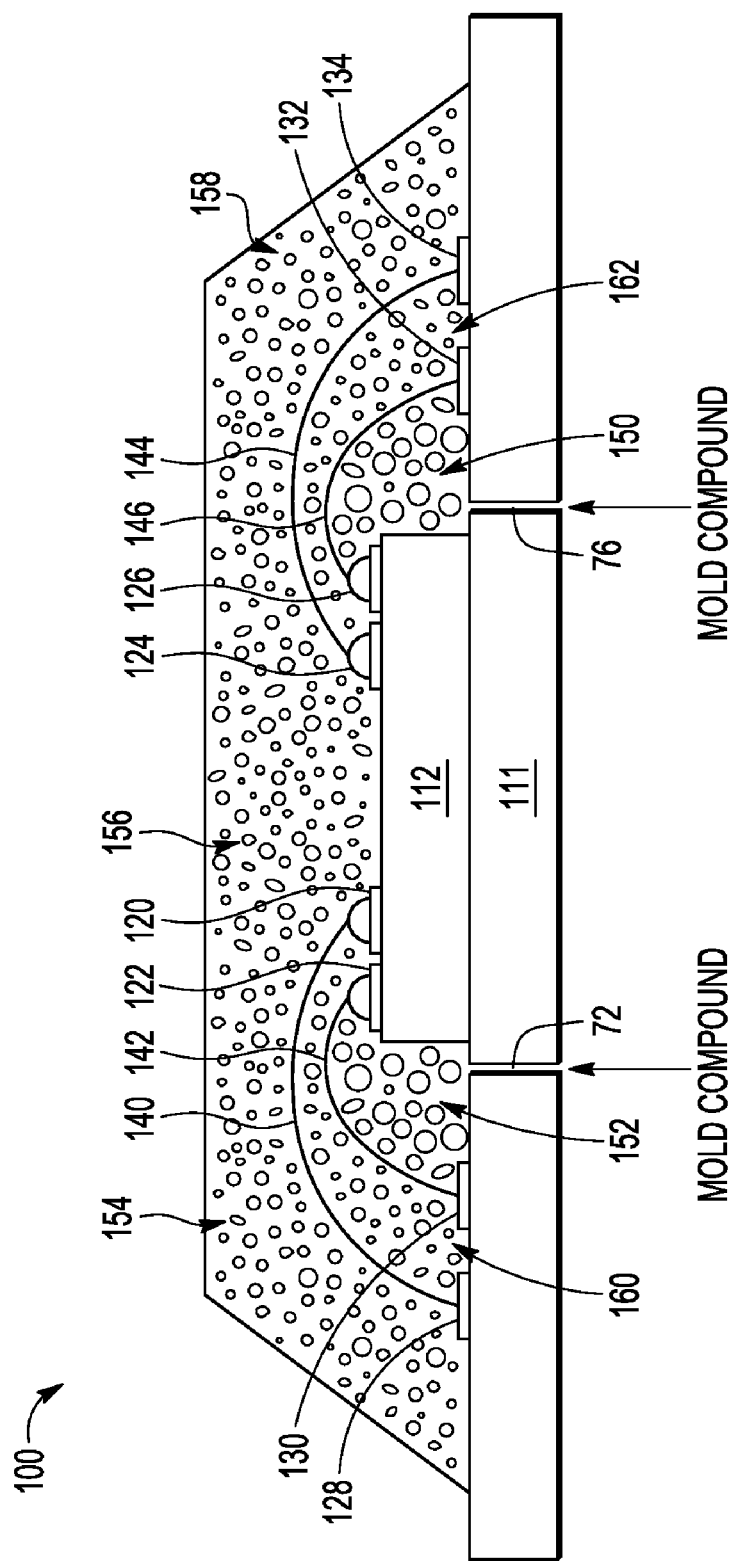
FIG. 4 shows a cross-section view of the exemplary molded semiconductor package of FIG. 3.

FIG. 4 shows a cross-section view (4-4) of exemplary molded semiconductor package 100 of FIG. 3. The same reference numerals as used as in FIG. 3 are used to point out the same elements of molded semiconductor package 100 and are described with reference to FIG. 4 only as needed. The cross-section view of molded semiconductor package 100 shows the filler material particles, illustrated by oval and spherical shapes of various sizes, embedded in resin material. Since, during the forming of the mold cap, the molding compound is injected via openings 70, 72, 74, and 76, for example (note that only openings 72 and 76 are shown in FIG. 4, since it is a cross-section view), the filler material is not screened out from regions of molded semiconductor package 100 where the absence of the filler material can cause a mismatch between the CTE of the mold compound and substrate 111 and die 112. This is because even though wire density may be high along the die edge, since the mold compound is injected from gates 72 and 76 (shown in FIGS. 3 and 4), the filler material is not screened out by the wires. This in turn ensures that low filler regions are not formed in areas where the formation of such low filler regions may cause reliability problems with the molded semiconductor package 100. This method of injecting mold compound results in formation of regions with high and medium amounts of filler material. By way of example, FIG. 4 shows: high filler regions 150 and 152 and medium filler regions 160, 162, 154, 156, and 158. In one embodiment, high filler region 150 may be a region between one side of die 112 and the low-profile wires on that side, such as wire 146 and low filler region 152 may be a region between another side of die 112 and the low-profile wires on that side, such as wire 142. In one embodiment, medium filler region 160 may be a region between the low-profile wires, such as wire 142 and the high-profile wires, such as 140 and medium filler region 162 may be a region between the low-profile wires, such as wire 146 and high-profile wires, such as wire 144. In one embodiment, medium filler regions 154, 156, and 158 may be the remaining regions of molded semiconductor package 100. By way of example, this method of injecting mold compound would result in the flow of the mold compound causing a higher concentration of the filler below wires, such as wires 142 and 146 than above these wires.

Additionally, by way of example, this method of injecting mold compound would result in the flow of the mold compound causing a higher concentration of filler adjacent to the sides of die 112. Although FIG. 4 shows a specific number of filler regions formed in specific areas of molded semiconductor package 100, the molded semiconductor package may include fewer or additional filler regions formed in other areas.

Figure 5:
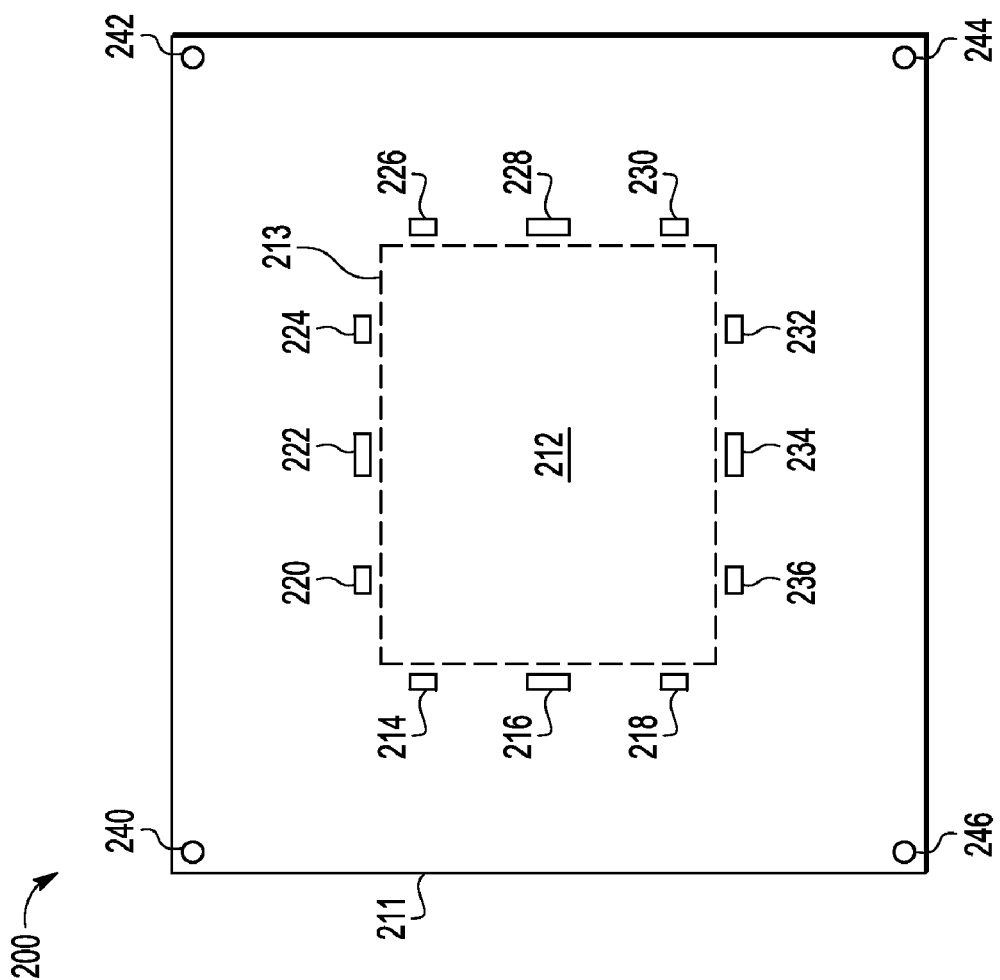
FIG. 5 shows a bottom view of another exemplary molded semiconductor package.

FIG. 5 shows a bottom view of another exemplary molded semiconductor package 200. Molded semiconductor package 200 may have the same components and the features as molded package 100, as described above with respect to FIG. 4. Molded package 200 may include a package substrate 211 and a die 212. However, unlike molded package 100 that has only four openings (gates 70, 72, 74, and 76) for injecting mold compound, molded package 200 may have twelve gates: 214, 216, 218, 220, 222, 224, 226, 228, 230, 232, 234, and 236. These gates may be arranged adjacent to die 212, for example. As shown in FIG. 5, the gates may have different sizes. By way of example, gate 216 is larger in at least one dimension than gates 214 and 218 located on the same side of die 212. Similarly, by way of example, gate 222 is larger in at least one dimension than gates 220 and 224; gate 228 is larger in at least one dimension than gates 226 and 230; and gate 234 is larger in at least one dimension than gates 232 and 236. Package substrate 211 may have vents 240, 242, 244, and 246 to vent out any air that may be displaced by the flowing molding compound during the forming of the mold cap. Although FIG. 5 shows a specific number of gates arranged in a certain manner, molded semiconductor package 200 may have additional or fewer gates arranged in a different manner. In addition, their relative sizes may be adjusted to achieve the desirable filler density and/or concentration profile.

By now it should be appreciated that there has been provided methods and structures for molded semiconductor packages. Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of packaging an integrated circuit on a package substrate, comprising:
   attaching the integrated circuit to the package substrate;
   forming electrical connections between the integrated circuit and the package substrate using a first plurality of bond wires connected to a first plurality of bond posts on the package substrate and a first plurality of bond pads along a first side of the integrated circuit and a second plurality of bond wires connected to a second plurality of bond posts on the package substrate and a second plurality of bond pads along a second side of the integrated circuit; and
   injecting mold compound through a plurality of openings in the package substrate, wherein a first opening of the plurality of openings is between the first plurality of bond posts and the first side and a second opening of the plurality of openings is between the second plurality of bond posts and the second side, wherein the injecting results in applying the mold compound over the integrated circuit and the package substrate, and wherein the plurality of wire bonds function to screen out a portion of filler from the mold compound during the injecting so that a first region of the mold compound has a first concentration of filler that is evenly distributed throughout an entirety of the first region, and a second region of the mold compound has a second concentration of filler that is evenly distributed throughout an entirety of the second region, the first concentration of filler being greater than the second concentration of filler, and wherein the first region includes all of the mold compound between the first and second plurality of wire bonds and the first and second sides to which the first and second plurality of wire bonds are adjacent, and the second region of the mold compound includes all of the mold compound between the first and second plurality of wire bonds and a mold cap boundary.

2. The method of claim 1, wherein:
   the step of forming further comprises using a third plurality of bond wires connected to a third plurality of bond posts on the package substrate and a third plurality of bond pads along a third side of the integrated circuit and a fourth plurality of bond wires connected to a fourth plurality of bond posts on the package substrate and a fourth plurality of bond pads along a fourth side of the integrated circuit; and
   the step of injecting further comprises injecting the mold compound through a third opening of the plurality of openings wherein the third opening is between the third plurality of bond posts and the third side and through a fourth opening of the plurality of openings wherein the fourth opening is between the fourth plurality of bond posts and the fourth side.

3. The method of claim 1, wherein the step of injecting further comprises injecting mold compound through a third opening of the plurality of openings wherein the third opening is between the first side and the first plurality of bond posts.

4. The method of claim 3, wherein the third opening is a different size from the first opening.

5. The method of claim 4, wherein the step of injecting comprises injecting the mold compound through a fifth opening of the plurality of openings wherein the fifth opening is between the first plurality of bond posts and the first side, through a sixth opening of the plurality of openings wherein the sixth opening is between the second plurality of bond posts and the second side, through a seventh opening of the plurality of openings wherein the seventh opening is between the third plurality of bond posts and the third side, and through an eighth opening of the plurality of openings wherein the eighth opening is between the fourth plurality of bond posts and the fourth side.

6. The method of claim 5, wherein the step of injecting is further characterized as causing the molding compound located adjacent to the first side, the second side, the third side, and the fourth side and under the plurality of bond wires to have a higher concentration of the filler than the mold compound located above the plurality of wire bonds.

7. The method of claim 1, wherein the mold compound comprises the filler and resin, wherein the step of injecting results in the plurality of wires causing a higher concentration of the filler below the plurality of wires than above the plurality of wires.

8. The method of claim 1, wherein as the mold compound passes through the first and second openings during the step of injecting, the mold compound has a first concentration of the filler and has a second concentration greater than the first concentration adjacent to the first and second side after the step of injecting.

9. The method of claim 1, wherein:
the first side terminates at a first corner and a second corner; and
the first opening is spaced away from the first corner and the second corner.

10. The method of claim 1, wherein the step of injecting is further characterized by the first opening being of a different size than the second opening.

11. A packaged integrated circuit, comprising a package substrate;
an integrated circuit on a top surface of the package substrate, wherein the integrated circuit has a first side, a second side, a third side, and a fourth side;
a first plurality of wire bonds along the first side extending from the top surface of the package substrate to the integrated circuit;
a second plurality of wire bonds along the second side extending from the top surface of the package substrate to the integrated circuit; and
mold compound over the package substrate and the integrated circuit wherein a first region of the mold compound includes all of the mold compound between the first and second plurality of wire bonds and the first and second sides to which the first and second plurality of wire bonds are adjacent, and the first region of the mold compound has a first concentration of filler that is evenly distributed throughout an entirety of the first region, and a second region of the mold compound includes the mold compound between the first and second plurality of wire bonds and a mold cap boundary, and the second region of the mold compound has a second concentration of filler that is evenly distributed throughout an entirety of the second region, the first concentration of filler being greater than the second concentration of filler.

12. The packaged integrated circuit of claim 11, wherein the package substrate has a plurality of openings in the package substrate filled with mold compound, wherein a first opening of the plurality of openings is adjacent to the first side and a second opening of the plurality of openings is adjacent to the second side.

13. The packaged integrated circuit of claim 11, further comprising:
a third plurality of wire bonds along the third side extending from the top surface of the package substrate to the integrated circuit;
a fourth plurality of wire bonds along the fourth side extending from the top surface of the package substrate to the integrated circuit; and
mold compound over the package substrate and the integrated circuit wherein the mold compound under the third and fourth plurality of wire bonds adjacent to the third and fourth sides has a concentration of filler greater than that of the mold compound over the third and fourth plurality of wire bonds.

14. The packaged integrated circuit of claim 11, further comprising:
a first plurality of bond posts on the package substrate coupled to the first plurality of wire bonds;
a second plurality of bond posts on the package substrate coupled to the second plurality of wire bonds;
a third plurality of bond posts on the package substrate coupled to the third plurality of wire bonds; and
a fourth plurality of bond posts on the package substrate coupled to the fourth plurality of wire bonds;
a first opening in the package substrate filled with mold compound located between the first side and the first plurality of bond posts;
a second opening in the package substrate filled with mold compound located between the second side and the second plurality of bond posts;
a third opening in the package substrate filled with mold compound located between the third side and the third plurality of bond posts; and
a fourth opening in the package substrate filled with mold compound located between the second side and the second plurality of bond posts.

15. The packaged integrated circuit of claim 12, wherein the first opening has a different size from the second opening.

16. The packaged integrated circuit of claim 12, further comprising
a third opening in the package substrate filled with mold compound located between the first side and the first plurality of bond posts.

17. The packaged integrated circuit of claim 16, wherein the first opening has a different size from the third opening.

18. A method of forming mold compound over an integrated circuit attached to a top surface of a package substrate, comprising:
attaching bond wires between the package substrate and along each side of the integrated circuit;
forming a plurality of openings in the package substrate under the wire bonds, wherein each side of the integrated circuit has at least one opening of the plurality of openings adjacent thereto; and
injecting mold compound through the plurality of openings, wherein the plurality of wire bonds function to screen out a portion of filler from the mold compound during the injecting so that a first region of the mold compound has a first concentration of filler that is evenly distributed throughout an entirety of the first region, and a second region of the mold compound has a second concentration of filler that is evenly distributed throughout an entirety of the second region, the first concentration of filler being greater than the second concentration of filler, and wherein the first region includes all of the mold compound between the first and second plurality of wire bonds and the first and second sides to which the first and second plurality of wire bonds are adjacent, and the second region of the mold compound includes all of the mold compound between the first and second plurality of wire bonds and a mold cap boundary.

19. The method of claim 18, wherein the step of injecting is further characterized as causing mold compound to form over the integrated circuit and the package substrate so that a first concentration of the filler of the mold compound adjacent to each side of the integrated circuit and under the bond wires is greater than a second concentration of the filler of the mold compound over the bond wires.

* * * * *